US006679672B1

(12) United States Patent
Barrows

(10) Patent No.: US 6,679,672 B1
(45) Date of Patent: Jan. 20, 2004

(54) TRANSFER PORT FOR MOVEMENT OF MATERIALS BETWEEN CLEAN ROOMS

(75) Inventor: John F. Barrows, Bluffton, SC (US)

(73) Assignee: Syracuse University, Syracuse, NY (US)

( * ) Notice: Subject to any disclaimer, the term of this patent is extended or adjusted under 35 U.S.C. 154(b) by 0 days.

(21) Appl. No.: 10/384,858

(22) Filed: Mar. 10, 2003

(51) Int. Cl.⁷ .............................................. B65G 1/133
(52) U.S. Cl. .................... 414/217; 414/217.1; 414/292
(58) Field of Search .............................. 414/217, 217.1, 414/220, 221, 292

(56) References Cited

U.S. PATENT DOCUMENTS

| | | | |
|---|---|---|---|
| 3,340,821 A | | 9/1967 | Wesener |
| 4,534,389 A | * | 8/1985 | Tullis ........................ 414/217.1 |
| 4,630,216 A | | 12/1986 | Tyler et al. |
| 4,667,580 A | | 5/1987 | Wetzel |
| 5,740,845 A | * | 4/1998 | Bonora et al. .............. 141/292 |
| 6,068,668 A | * | 5/2000 | Mastroianni ................ 29/25.01 |
| 6,220,808 B1 | * | 4/2001 | Bonora et al. .............. 414/217 |
| 6,470,927 B2 | * | 10/2002 | Otaguro ........................ 141/98 |
| 6,561,894 B1 | * | 5/2003 | Miyajima ..................... 454/187 |

* cited by examiner

Primary Examiner—Khoi H. Tran
(74) Attorney, Agent, or Firm—Wall Marjama & Bilinski LLP

(57) ABSTRACT

A transfer port facilitates transfer of a material between clean room modules, and/or between a clean room module and a clean box transporter that can travel through the contaminated ambient environment. A transfer port permits transfer of clean material between Class 1 clean rooms without degrading their cleanliness levels. The clean box transporter cars each comprise a small self-propelled clean room with laminar air flow and a HEPA filter. A door on the clean box mates against a similar door on one wall of the clean room module. A seal between a transporter car door and its opening, and a seal between a clean room door and its opening, a pair of seals disposed inside and outside a split line together define a limited contaminated volume. This volume is evacuated and/or flushed with clean gas to remove as much particulate matter as possible. The clean box transporter car has a slight overpressure with respect to the clean room module so when the transporter port is opened, any remaining particles will move away from the opening and into the clean room module, where they are entrained away in its laminar air flow and filtered out.

6 Claims, 4 Drawing Sheets

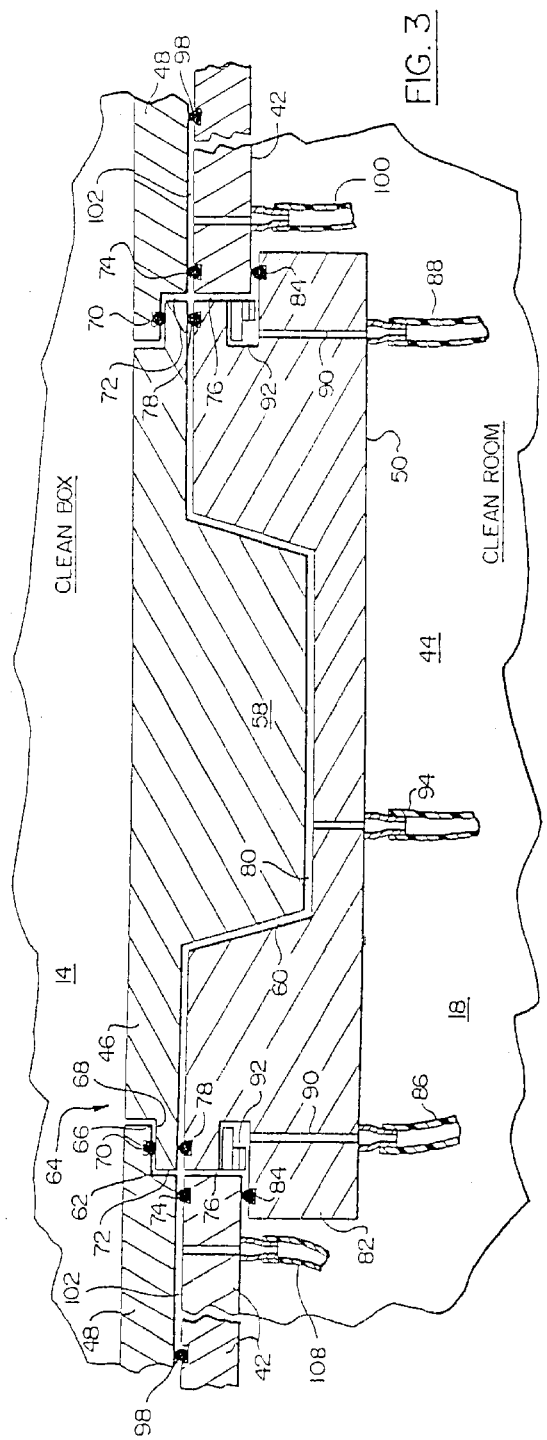

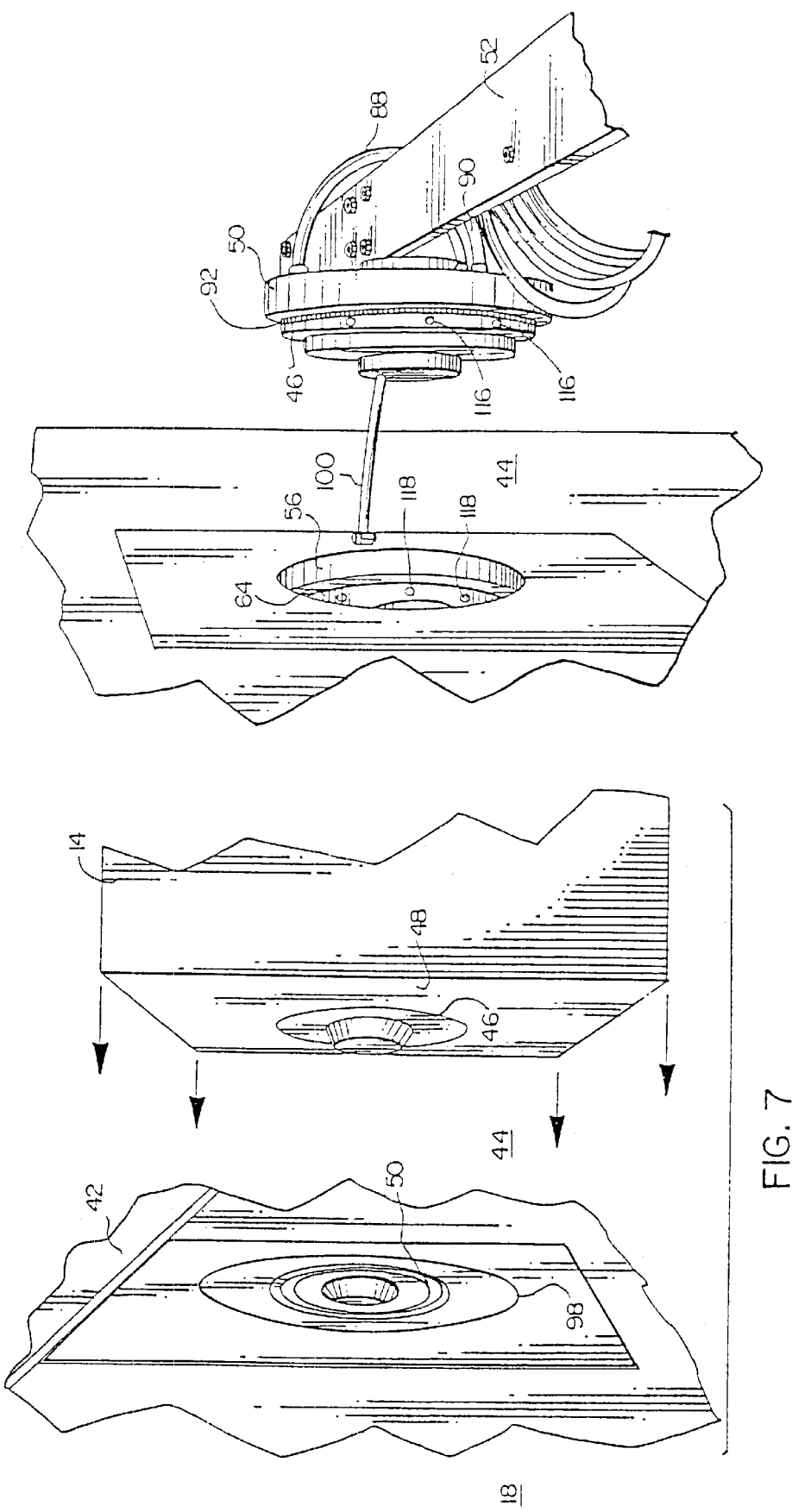

TRANSFER PORT FOR MOVEMENT OF MATERIALS BETWEEN CLEAN ROOMS

BACKGROUND OF THE INVENTION

This invention is directed to transfer ports for movement of materials from one clean room to another, and is more particularly directed to a port assembly in which contaminated areas of respective port surfaces are sealed off from contact with the interior of the clean rooms to minimize the amount of particulate matter introduced into the clean room when the port assembly is opened. The invention is specifically intended for a transfer port which permits movement of clean material between Class 1 clean rooms with no change in contamination levels.

High density circuit integration requires an extremely high standard in contamination control. This is especially true in the manufacture of semiconductor sub-micron geometry integrated circuits. The semi-conductor industry has developed the ability to create thousands of circuits upon a miniature chip, but the ability to practice this efficiently is possible only where substantially all sub-micron contaminants particles are eliminated from the air that contacts the semiconductor wafers. Other manufacturing industries, such as thin-film processing, opto-electronics, powder metallurgy, paints, pigments, and those employing critical assemblies such as laser and hard disk drives, have improved their production yields by careful control of particulate contaminants.

Industries that require contamination control to protect the users of their products include pharmaceutical manufacturers, food processors, manufacturers of medical devices e.g. surgical needles and artificial joints. In health care, environmental control can be critical to surgical procedures and special patient care, especially in delicate cases such as immune deficiency or severe burns.

To benefit any of the above-mentioned industries and practices, it is envisioned that a suitable clean room environment would include a number of interlinked clean rooms, which would be small and modular in order to achieve Class 1 conditions. In such a system, small, modular clean rooms would serve as micro-environments or work cells which would be integrated into the manufacturing process with robots and automated material handling equipment. In this system, the material handling equipment would consist of internally clean containers, or "clean boxes," arranged as automatic transporters, where the clean boxes would carry material between the clean micro-environments in the various work cells. This concept is advantageous in that most of the contaminants and particle-shedding moving parts are external to the clean environment, so that contaminants inside the clean environment would be much easier to control. Also, in such a system, the area in which human workers are present would be outside the clean environment. This means that the workers are free to move about without gowns or other awkward clothing because they are removed from the clean space. Also, because temperature and humidity control are required for maintenance of the clean work space, the modular microenvironment concept represents a major energy savings, because the workers are no longer contributing to the humidity and temperature in the clean space.

However, a key to this modular system is the ability to move work material between modular clean rooms and transport containers without contamination of the material or the clean space. This requires that the clean rooms and the clean transport containers be provided with a port or door system that limits the amount of contamination from the port when opened to connect the clean box to the clean room, but which can be left exposed to the exterior environment when the clean box is traveling between stations. Because the exterior surfaces of the clean box transporters and the clean room work cells are exposed to contamination, this requires that the contamination between these surfaces be isolated to as small a volume as possible. The object is to provide a doorway through which the clean material can pass uncontaminated between the clean box and clean room.

Modular clean rooms are currently available, e.g., as described in U.S. Pat. No. 4,667,580, which can serve as clean microenvironment work cells. A tracked, automated transport system, employing electrically powered cars capable of being adapted to clean box transports, is also available e.g. as described in U.S. Pat. Nos. 3,340,821 and 4,630,216. However, these presently-available items lack a port arrangement through which the workpiece material can pass uncontaminated.

One approach to transporting of materials between clean environments has been the standardized mechanical interface, or SMIF, e.g., as described in U.S. Pat. Nos. 4,534,389 and 4,532,970. In the SMIF system a small box is provided to carry semiconductor wafers or the like from one machine to another machine. The SMIF system joins the machines to the boxes by a pair of dockable doors. These doors fit together to trap contaminant particles that are on the outer surfaces of the doors. Once linked together, the doors move a s a unit into the clean interior space of the machine. However, the SMIF system has no structure to control or limit contamination at the split lines, i.e., where the doors close onto their respective chambers. The amount of contamination from this area can be considerable when Class 1 conditions are observed.

In this discussion of clean environments, the "class" of the environment indicates the maximum possible number of particles 0.5 microns in diameter or larger in each one cubic foot of air. Thus, a "Class 1" environment contains one such particle for each cubic foot of air, a "Class 10" environment may have ten times as many particles for each unit volume.

SUMMARY OF THE INVENTION

It is an object of this invention to provide a system for movement of material, without contamination, between Class 1 clean room module work stations.

It is another object of this invention to provide a mating port system for the modular clean room and clean box transporter which permit transfer between the clean room and clean box without contamination of the material.

It is a further object of this invention to provide a transfer port assembly in which the surfaces of the clean room and clean box ports, that are exposed to the contaminated environment and are exposed to the clean environment during transfer, are confined to a limited volume which can be substantially cleaned of particulate contaminants prior to opening the ports.

In accordance with an aspect of this invention, an interengaging port assembly mates a clean box type transporter to a modular clean room to permit transfer of materials between the clean box transporter and the clean room without contaminating the interiors of the clean room and clean box, and without contaminating the material. A port assembly portion on the clean box transporter includes a door that has an outer surface exposed to the contaminated environment and an inner surface that faces the interior of the clean box. The clean box port also includes a flat wall portion of the box which has an opening therein that accommodates the door, the opening having a peripheral recess surrounding a central passage so that a transverse surface of the peripheral recess mates against a peripheral surface of the door, with a seal, e.g., a sealing ring disposed between these transverse surfaces. This seals the interior of the clean room from an annular split space that is defined between the opening and the periphery of the door. A clean room port is disposed on each of the clean room modules, and includes a clean room door that has an outer surface of the same dimensions as the outer surface of the clean box door. The clean room door also has a transverse peripheral flange entirely surrounding the door on the side away from its outer surface. An opening in one flat wall of the clean room accommodates the clean room port door and is dimensioned so that the clean room port door can be retracted into the interior. The clean box door, which is held onto the clean room door, passes with it through the clean room port opening. There is a first seal on the outer surface of the clean room wall outside the rim of the opening and entirely surrounding it to seal between the clean room wall and the wall of the clean box outside the rim of the clean box opening. A second seal is disposed on the clean room door and is disposed a short distance in from the rim of the door. This seals against the clean box door and seals off substantially all of the contaminated outer surfaces thereof from the split space that was referred to earlier. A third seal is disposed on the transverse flange of the clean room port door to seal the interior of the clean room module from an annular split volume that is defined by the opening in the clean room wall and the periphery of the clean room prot door. The seal of the clean box port together with the first, second, and third seals define a limited volume that is exposed to the contaminated ambient when the clean box and clean room are remote from one another, and is also in communication with the interiors of the clean room and clean box when the port is opened.

When the materials are to be transferred from a clean box to the clean room or vice versa, the clean box transporter is brought into position alongside the clean room and the clean box port is brought into registry with the clean room port. Then the doors are clamped together, e.g. by applying vacuum to the contaminated space defined within the second seal. The clean box is also held firmly against the clean room wall. To this end, a fourth seal can be disposed on the outer surface of the clean room wall outside the first seal to define an annular volume between the first and fourth seals and between the facing flat surfaces of the clean room and clean box. A vacuum applied to this volume clamps the clean box in position and also ensures a good seal around the openings of the clean room port and clean box port. The limited volume at the split between the doors and their respective openings is flushed with a clean gas and/or a vacuum is applied to remove as much of the particulate matter as possible from the surfaces there. Then the door is slowly opened towards the interior of the clean room. There is a slightly higher pressure in the clean box than in the clean room, so that when the port assembly is opened, there will be an air flow into the clean room. This flow carriers any particulates in and away from the materials in the clean box. The small number of particles resulting from this become entrained in the clean room air flow and are filtered out. After this, the material transfer takes place without contamination, and then the opening process is reversed to close the port doors. A latch mechanism in the clean box port door holds the door closed and sealed in place in the clean box opening.

The clean box transporter is preferably a miniature clean room in that it recirculates and filters air to maintain a clean environment within. The clean box contains an air handling mechanism, preferably producing a gentle, laminar air flow within the box, while filtering the recirculating air through a high efficiency particulate air (HEPA) filter system. The clean box can be of a design with self-propelled drive and wheels which follow a track to the various clean room module work stations.

A wide variety of design options are possible, but one operative example is described in the following text. Many other objects, features, and advantages of the invention will become apparent from the ensuing description of one preferred embodiment which should be read in connection with the accompanying Drawing.

BRIEF DESCRIPTION OF THE DRAWINGS

FIG. 3 is a cross section of a clean room—clean box transfer port assembly according to one preferred embodiment of this invention.

FIG. 5 is a perspective view of the exterior of a clean room wall showing the clean room section of the transfer port assembly.

FIG. 6 is a perspective view of a clean box transporter showing the clean box portion of the transfer port assembly.

FIG. 7 is a perspective view illustrating the mating of the clean bo portion of the transfer port assembly.

FIG. 8 is a perspective view illustrating the opening of the combined clean room and clean box port assembly doors.

DETAILED DESCRIPTION OF THE PREFERRED EMBODIMENT

Figure 1:
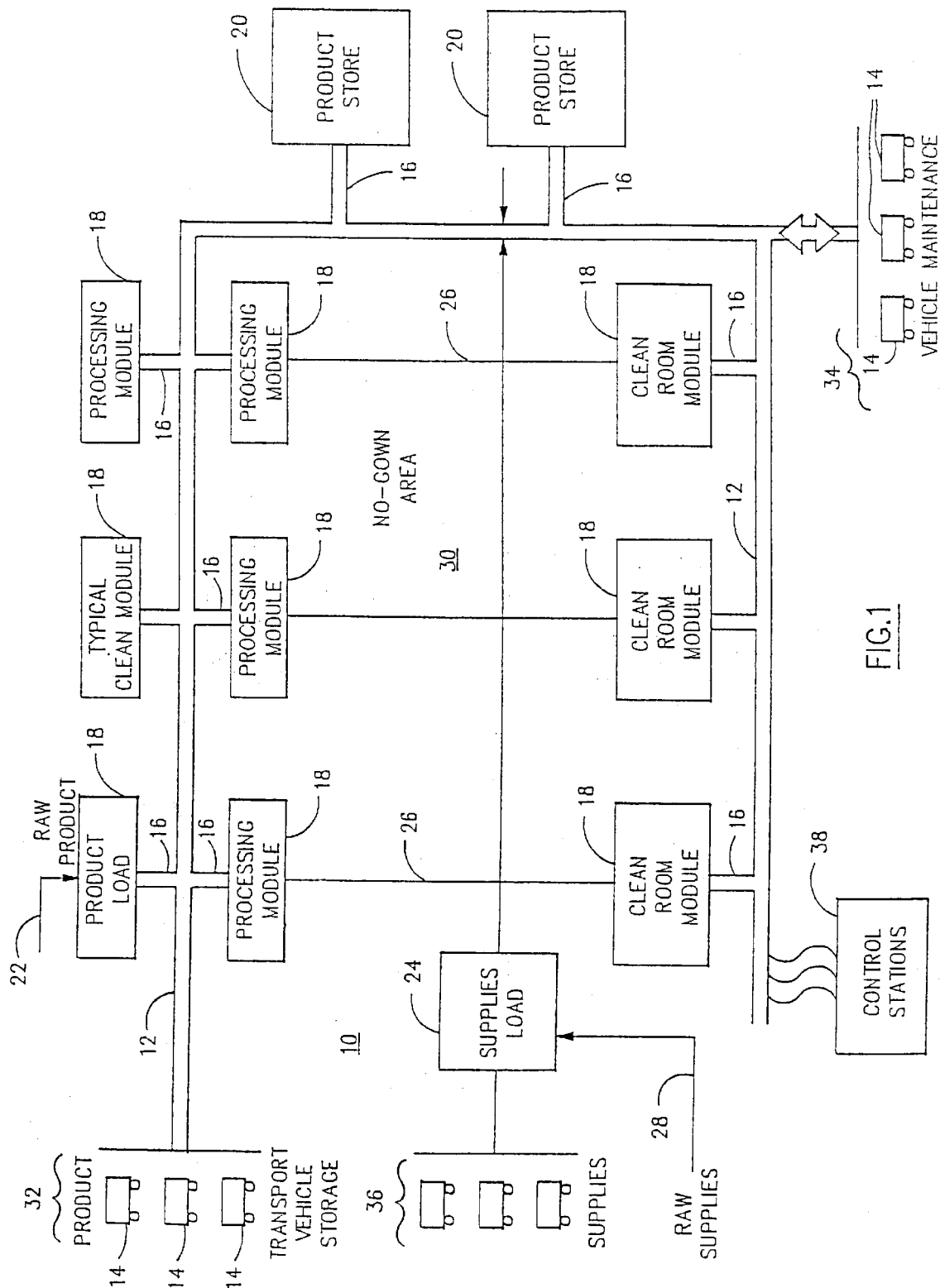
FIG. 1 is a system schematic diagram of a manufacturing facility in which a product is transferred from one modular clean room to another under dust-free conditions, but in which the ambient outside the clean room modules is not maintained at clean room conditions.

With reference to the Drawing, FIG. 1 shows a processing system 10 for a manufacturing facility in which a highly dust sensitive workpiece is subjected to a number of process steps which must occur in extremely clean environments. This system 10 can be used for production of high density semiconductor integrated circuits, for the bioengineering of delicate organisms, or elsewhere where an extremely clean environment, up to Class 1 (i.e., no more than one particle 0.5 microns in diameter per cubic foot) is required for effective operation.

In this processing system, a rail system 12 is provided on which travel transport vehicles or cars 14, which are basically clean boxes on wheels. The rail system has a number of spur lines 16 which connect with various clean room modules 18, and with product storage clean rooms 20. A raw material entry port 22 is provided on one or more of the clean room modules 18, for introducing workpieces, e.g. silicon wafers. A supplies loading station 24 connects with a supply net 26 that connects in turn with at least certain ones of the clean room modules 18. Here, the supplies can be additional solid workpieces or various liquids, such as reagents or solvents. A raw supplies entry port 28 feeds the loading stations 24.

As all of the process steps take place within the various clean room modules 18, and transfer between these modules takes place by means of the clean box transporters or cars 14, the environment external to the modules 18, storage rooms 20, and cars 14 can be maintained under normal ambient conditions. Thus, this area provides a no-gown work area 30 for the human workers, which is separate from the clean environment. That is, particle shedding by workers will not affect the environment inside the clean room modules 18, nor will workers be exposed to toxic fumes, vapors, bacteria, viruses, or other health hazards which might be present inside the clean room modules 18.

A finished-product car storage area 32, a vehicle maintenance area 34, and a supply inventory area 36 are provided along the rail system 12. A control station 38 connects with the rail system 12 to supply power and signals along the tracks of the rail system 12 for powering, controlling, and identifying the various cars 14 that are traveling between the various clean room work stations.

Figure 2:
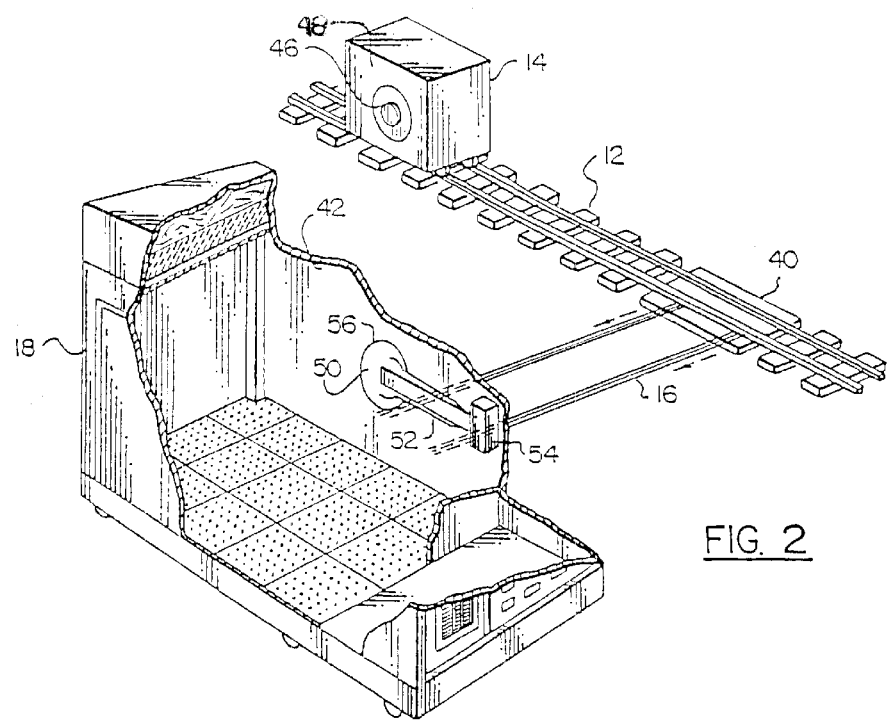
FIG. 2 is a partial schematic of a clean room and clean box transporter or vehicle, with a portion of a track system of the manufacturing facility of FIG. 1.

As shown in FIG. 2, the rail system 12 has a switch 40 that travels along the spur 16 to bring one of the cars 14 alongside a side wall 42 of one of the clean rooms 18. This clean room can be a modular clean room of the type described in U.S. Pat. No. 4,667,580.

A transfer port assembly 44, for transferring materials between the car 14 and the clean room module 18 comprises a generally circular door 46 on one flat wall 48 of the car 14, and a mating circular door 50 on the wall 42 of the clean room module 18. A swing arm 52 mounts the clean room door 50 by means of a hinge mechanism 54 that is located at some distance from an opening 56 into which the door 50 is fitted. This ensures that any particulate matter that is generated or shed from the hinge mechanism 54 will occur far from the opening 56 and be carried away and filtered out from the air without risk of contaminating the product in transfer between the clean room module 18 and the clean box car 14.

Figure 4:
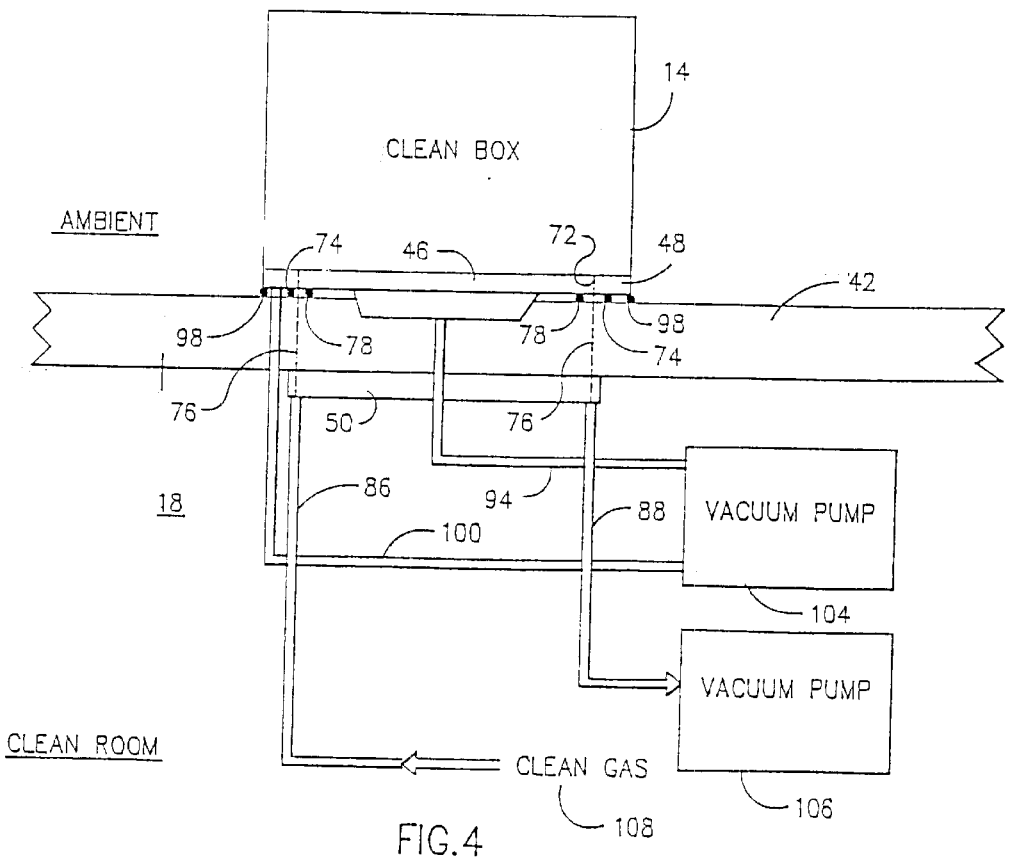
FIG. 4 is a schematic of the port assembly of FIG. 3.

As shown in FIGS. 3 and 4, the clean box door 46 and the clean room door 50 are adapted to mate and seal against one another. Here, the door 46 has a male protuberance or nose 58 centrally positioned thereon to fit into a female recess 60 that is centrally disposed in the clean room door 50. The protuberance 58 and recess 60 serve to ensure that the doors 50 and 46 position themselves in registry with one another.

A peripheral recess 62 is provided in a circular opening 64 for the door 46 the recess 62 provides a flat, recessed surface 66 that mates with a rear, flat peripheral surface 68 on the portion of the door 46 that faces towards the interior of the car 14. An annular seal 70 is compressed between the surfaces 66 and 68, and seals off a split line 72 that is defined by the periphery of the door 46 and the opening 64.

On the clean-room portion of the port assembly 44, and annular seal 74 surrounds a split line 76 between the clean room door 50 and the opening 56. This seal 74 compresses between wall 42 and the wall 48 of the clean box car 14 to seal off the split lines 72 and 76 from the ambient. Another annular seal 78 is disposed on the door 46 just inside the split line 74. This seal 78 compresses between the doors 46 and 50, and with them defines a contaminated volume 80. This volume 80 includes the major portion of the outer surfaces of the door 46 and 50, and any particles resting on these outer surfaces are trapped in the volume 80 within the seal 78.

A flange 82 integrally formed on a proximal inner side of the door 50 extends radially from the door periphery and has an annular seal 84 which compresses against an interior side of the wall 42 of the clean room module 18, and seals off the split line 76 from the inside of the clean room 18.

The seals 70, 74, 78, and 84 together define a limited volume round the split lines 72 and 76. This limited volume is exposed to the contaminated, no-gown area 30 when the car 14 and clean room 18 are separated, and is also exposed to the clean environment when the port assembly 44 is opened. All the remaining surfaces are sealed off from the interior of the clean room 18 and the interior of the clean box 14.

In order to minimize the number of particles carried into the clean environment from this limited volume, means are provided for flushing this volume e.g. with a clean gas. As shown in FIGS. 3 and 4, first and second vacuum gas lines 86 and 88 connect to respective gas passages 90 that communicate with a plenum 92 disposed at a periphery of the door 50 beyond the seal 84. Preferably, the plenum 92 has openings over the circumference of the door. The limited volume can be evacuated and flushed, e.g. with nitrogen or clean air, to remove any particulates.

An additional vacuum line connects to the contaminated volume 80 between the doors 46 and 50. A vacuum is applied here to evacuate the space 80 defined by the annular seals 78 to hold the door 46 firmly against the door 50, and also to ensure any leakage will be from the clean area into the contaminated space 80. Another sealing ring 98 is shown here surrounding the seal 74, and which is compressed between the wall 42 of the clean room and the wall 48 of the clean box car 14. One or more vacuum lines 100 communicate with an annular space 102 defined between the wall 42, 48 and the seals 74, 98. A vacuum is applied to this space 102 to draw the clean box car 14 against the wall 42 of the clean room 18 to hold the same firmly together, with the doors 46, 50 in registry. The vacuum applied to this space 102 also ensures that any leakage will be from the clean area to the contaminated area in the space 102.

As shown in FIG. 4, a vacuum pump 104 connects tot he lines 94 and 100, and a vacuum pump 106 and clean gas source 108 can be selectively connected with the lines 86 and 88.

The door 50 and the remainder of the clean room portion of the transfer port 44 can be arranged as shown in FIG. 5, where the female recess 60 is centrally disposed in the circular door 50, and where the seals 78 and 74 are concentrically arranged just inside and just outside the split line, respectively. The clean box transporter or car 14 can be arranged as generally indicated in FIG. 6, wherein the male protuberance 58 is situated centrally on the circular door 46. The radius from the center of the door 46 to the rim at the split line 72 is the same as the corresponding radius on the door 50 of the clean room, so that when the two are mated together, the door 46, carried on the door 50, will open in to the clean room.

As mentioned previously, the car 14 is arranged as a small. self-propelled clean box and includes a recirculating air handling system 110 indicated by ghost lines in FIG. 6. This generates a laminar flow of air within the box, which passes through a HEPA filter 112, and then proceeds downwards to a floor plenum. The recirculating air handling system 110 can be controlled remotely, i.e., from the control station 38, and maintains an internal pressure that is at least slightly greater than the pressure inside the clean room modules 18. This overpressure is typically on the order of 1 to 3 millimeters of water.

Each car 14 is provided with a drive system including wheels 114 which travel on the track 12. Electric power and signals are transmitted tot he drive system on the track, for propelling the cars 14 and controllably guiding them to their proper destinations.

The actions of the transfer port assembly 44 can be explained with reference to FIGS. 7 and 8. As shown in FIG. 7, a clean box transporter car 14 is carried against the wall 42 of the clean room 18. The door 46 of the clean box is disposed in registry with the door 50, with the protuberance 58 residing within the recess 60. At this time, the seals 74 and 98 are compressed between the clean room wall 42 and the clean box wall 48, while the seal 78 is compressed between the two circular doors 46 and 50. The contaminated space 80 between the doors 46 and 50 and the contaminated space 102 between the seals 74 and 98 are evacuated to hold the clean box car 14 against the clean room wall 42, and to hold the clean box door 46 firmly against the clean room door 50. Vacuum is applied to the lines 88 and 90 and then clean gas, or vacuum and clean gas alternately, are applied through these lines 88 and 90 and through the plenum 92 to the limited contaminated space around the split lines 72 and 76. After this space has been cleaned sufficiently, and the pressure in split lines 72 and 76 is equalized with the pressure inside the clean room, the swing arm 52 is moved, and the clean room door 50 and the engaged clean box door 46 are slowly withdrawn into the interior of the clean room module 18. For some applications, a sterilizing fluid can be applied to sterilize the surfaces of the split lines 72 and 76 prior to opening the doors 46 and 50. This leaves a substantially clean port hole defined by the two openings 56 and 64. The slight overpressure within the car 14 ensures that no particulate matter is moved outwardly, away from the clean bo car 14 and the clean port hole in to the clean room module 18. There the particles, if any, are entrained away in the laminar air flow and are filtered out. After the paired doors are sufficiently withdrawn, the materials are transferred between the car 14 and the clean room module 18, and then the swing arm 52 slowly returns the doors 46 and 50 back to their closed position. After closure, normal pressure can be restored to the spaces 80 and 102, so that the car 14 can move to its next destination.

FIG. 8 also shows a position of latching means 116 in the periphery of the door 46 of the clean box car 14. Also shown are mating receptacles 118 along the periphery of the opening 64. The latching means 116 and receptacles 118 are disposed along the split line 72 outside the position of the seal 70.

While this invention has been described in detail with respect to one preferred embodiment, it should be understood that the invention is not limited to that precise embodiment. For example, the doors 46, and 50 need not be round, but can be any shape, so long as they can be sealably joined to limit the contaminated volume that contains the split line. Also, each clean room module could by configured with plural port doors to accommodate more than one clean box car 14. In addition to the disclosed embodiment, many modifications and variations would present themselves to those of skill in this art, without departing from the scope and spirit of this invention, as defined in the appended claims.

I claim:

1. An interengaging port assembly for mating a clean box transporter to a clean room to permit transfer of materials between the clean box transporter and the clean room without contaminating the interiors of the clean box and the clean room, comprising a clean box door on one flat wall of said clean box including an outer surface, a back surface facing the interior of said clean box, at a periphery of said back surface of the door a peripheral transverse surface, an opening in said clean box wall to accommodate said clean box door with a central passage and a peripheral recess surrounding said central passage at an outer surface of said one flat wall and defining a peripheral transverse surface to mate against the transverse surface of said door, sealing means disposed between the transverse surfaces of said clean box door and said clean box opening to deal the interior of said clean box transporter from a split space defined by the periphery of said door and said opening, and latch means for releasably holding the clean box door closed in said opening; and a clean room port including a clean room door that has an outer surface shaped to conform with the outer surface of the clean box door and has a transverse peripheral flange entirely around said clean room door on the side away from the outer surface, an opening in one all of the clean room to accommodate the clean room port door and dimensioned so that the clean box door can pass therethrough, a first seal on the outer surface of said clean room wall outside said clean room opening and surrounding the same to seal between said clean room wall and the wall of said clean box outside the clean box opening, a second seal on the outer surface of the clean room door spaced from the periphery thereof to seal against said clean bo door and seal off a central common volume, a third seal on the transverse flange of said clean room port door to seal against an inside surface of said clean room wall, said sealing means, first seal, second seal, and third seal defining a limited volume that is exposed to ambient conditions before the clean box is coupled to the clean room and is in communication with the clean room and clean box interiors when the port assembly is opened; means in fluid communication with said limited volume for cleaning said volume by gas injection or vacuum; means holding said clean box against said clean room with the clean box port located in registry with said clean room port; means for supporting the clean box door on said clean room door with said outer surfaces biased against one another; and means for carrying said clean room door and permitting at least limited travel of the same into the interior of said clean room with said clean box door carried thereon, to permit transfer of said material between said clean box transporter and said clean room.

2. The interengaging port assembly of claim 1 wherein said means for supporting the clean box door against said clean room door includes vacuum means communicating with said central common volume to apply a partial vacuum thereto.

3. The interengaging port assembly of claim 1 wherein said means for holding said clean box against said clean room includes a fourth seal which is in said clean room wall outer surface surrounding said second seal to define an annular zone which is closed off by the fourth seal, the first seal, the clean room wall outer surface and said clean box wall, and vacuum means in communication with said zone to apply a partial vacuum thereto.

4. The interengaging port assembly of claim 1 wherein said means in fluid communication with said limited volume includes a plenum connected to the interior side of said clean room port door having a plurality of apertures in a peripheral surface of said door distally of said third seal.

5. The interengaging port assembly of claim 1 wherein said clean box transporter is in the form of a self-contained recirculating closed vessel having a self-contained air handling system which produces a continuous laminar air flow within the clean box and including a HEPA filter for filtering particulates from the air flow within the clean box.

6. The interengaging port assembly of claim 5 wherein said self-contained air handling system maintains a pressure within the clean box which is at least slightly higher than a predetermined air pressure in said clean room, so that when said clean room door and clean box door are opened, any particulates will tend to move in the direction away from said clean box into said clean room.

* * * * *